United States Patent [19]

Bamberger

[11] Patent Number: 4,883,559
[45] Date of Patent: Nov. 28, 1989

[54] PROCESS FOR MAKING TRANSITION METAL NITRIDE WHISKERS

[75] Inventor: Carlos E. Bamberger, Oak Ridge, Tenn.

[73] Assignee: The United States of America as represented by the United States Department of Energy, Washington, D.C.

[21] Appl. No.: 180,753

[22] Filed: Apr. 12, 1988

[51] Int. Cl.[4] .................... C01B 21/06; C01B 21/076; C30B 1/10
[52] U.S. Cl. .......................... 156/603; 156/DIG. 75; 156/DIG. 87; 156/DIG. 99; 423/409; 423/411
[58] Field of Search ................ 423/409, 411; 156/603, 156/DIG. 75, DIG. 87, DIG. 99

[56] References Cited

U.S. PATENT DOCUMENTS 1,391,147  9/1921  von Bichowsky et al. ......... 423/411
1,391,148  9/1921  von Bichowsky et al. ......... 423/411

OTHER PUBLICATIONS

Chemical Abstracts Citation 107:108159a.
Bamberger et al, "Reaction of Titanium Dioxide with Sodium Cyanide at 1000° C.," *Reactivity of Solids*, 3 (1987) 165–170.
Kato et al, "Crystal Growth of Titanium Nitride by Chemical Vapor Deposition," Journal of Crystal Growth 29 (1975) 55–60.
Sugiyama et al, "Behaviour of Gold Metal as an Impurity for The Chemical Vapour Deposition of Titanium Nitride Whiskers on Quartz Glass," Chemistry Letters, pp. 363–366, 1975.
Bojarski et al, "Growth and Morphology of Titanium Nitride Whiskers," Journal of Crystal Growth 52 (1981) 290–295.
Pilyankevich et al, "Morphology of Titanium Nitride Single Crystals Produced from the Gaseous Phase," Institute of Materials Science, Academy of Sciences, pp. 35–39, Oct., 1977.

Primary Examiner—John Doll
Assistant Examiner—Wayne A. Langel
Attorney, Agent, or Firm—Katherine P. Lovingood; Stephen D. Hamel; Judson R. Hightower

[57] ABSTRACT

A process for making metal nitrides, particularly titanium nitride whiskers, using a cyanide salt as a reducing agent for a metal compound in the presence of an alkali metal oxide. Sodium cyanide, various titanates and titanium oxide mixed with sodium oxide react to provide titanium nitride whiskers that can be used as reinforcement to ceramic composites.

4 Claims, 1 Drawing Sheet

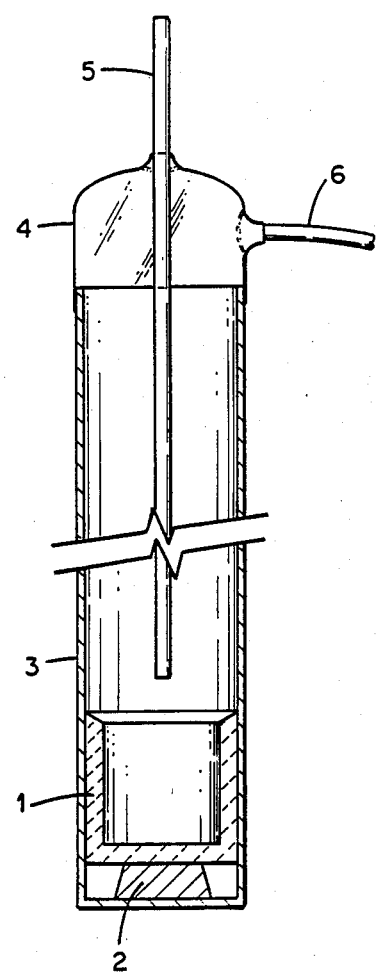

PROCESS FOR MAKING TRANSITION METAL NITRIDE WHISKERS

This invention relates to a process for making whiskers of transition metal nitrides, in particular titanium nitride, and was developed under a contract with the United States Department of Energy.

BACKGROUND

Whiskers are single crystals that have a high length to width ratio. When incorporated into the matrix of materials such as ceramics, the result can be a composite having improved strength and toughness. A great deal of research is being done in this area to improve the performance of ceramics in applications such as cutting tools, turbine parts and internal combustion engine parts.

Whiskers made of titanium nitride are of interest since the compound has a high melting point of 2950° C., a hardness of 8-9 in Moh's scale, exhibits good electrical conductance and is stable at high temperatures in inert atmospheres. However, the processes for making TiN whiskers have required a gas phase reaction between $TiCl_4$, $N_2$ and $H_2$ at temperatures above 1000° C., with the attendant problems of controlling the gas flow rate and the disposal of the HCl by-product. These processes are not only very expensive due to the extreme conditions required, but they also result in low product yields. Therefore, there is a continuing need for improved processes for making transition metal nitride whiskers in general and titanium nitride whiskers in particular.

SUMMARY OF THE INVENTION

In view of the above stated needs, it is an object of this invention to provide a process for making transition metal nitride whiskers that takes place in the solid/liquid phases.

It is another object of this invention to provide a process for making transition metal nitride whiskers that is relatively inexpensive using readily available starting materials.

Another object of this invention is to provide a process for making transition metal nitride whiskers that has a high conversion ratio of metal compound to metal nitride whiskers. Additional objects advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

To achieve the foregoing and other objects and in accordance with the purpose of the present invention, as embodied and broadly described herein, the process of this invention may comprise mixing a cyanide salt with a first compound selected from the group a transition metal nitride and a transition metal oxide and a second compound selected from the group a free alkali metal oxide and an alkali metal oxide that is associated with an anion that is not a strong oxidant. The mixture is then heated to about 1000° C. for not less than 15 hours in an inert atmosphere. Examples of a first compound include TiN, $TiO_2$, $Nb_2O_5$, $V_2O_5$ and $MoO_3$. Examples of the second compound include sodium oxides and potassium oxides. Carbonates and hydroxides can also be used because they react to convert to oxides upon heating to 1000° C. The invention is also a process for making transition metal nitrides wherein a cyanide salt is mixed with an alkali metal metallate, such as sodium titanates, potassium titanates, potassium chromates and sodium chromates, under similar conditions. Examples of the cyanide salt are sodium cyanide and potassium cyanide. The more cyanide in relation to transition metal nitride or oxide starting material used, the better the whisker formation.

The use of cyanide as a reductant to promote nitride formation in the presence of alkali metal metallates, or analogous transition metal nitride/oxide and alkali metal oxide combinations, is a important development in the area of whisker formation technology and the application of this process to a broad range of metals could have a significant impact in commercial whisker-reinforced ceramic production.

BRIEF DESCRIPTION OF THE DRAWING

The figure represents the apparatus that was used in the laboratory preparation of the titanium nitride whiskers.

DETAILED DESCRIPTION OF THE PREFERRED EMBODIMENT

In the early stages of the development of this invention, applicant found that sodium titanium bronze, which can be envisioned as being $TiO_2$ having some of the $Ti^{4+}$ replaced by $Na^+$ and $Ti^{3+}$, formed titanium nitride whiskers when exposed to sodium cyanide at temperatures of about 1000° C. The term "bronze" refers to oxides of metals such as vanadium, niobium, molybdenum, tungsten and titanium having mixed valences. In further exploratory experiments where whiskers were formed by conversion from TiN powder, $Na_2CO_3$ residue was concluded to have been present; whereupon, the applicant added $Na_2CO_3$ to the reaction and discovered that higher whisker yields were assured under these circumstances.

More experiments using various starting materials led applicant to the discovery that the critical requirements for making titanium nitride whiskers were a titanium compound, a cyanide salt and an oxide of an alkali metal. It is important that the alkali metal oxide not be associated to a strong oxidant anion which would interfere with the reducing properties of the cyanide. In the preliminary work described above, the starting material requirements were satisfied by providing sodium-titanium bronze, $NaTi_4O_8$, as a titanium compound as well as an oxide of an alkali metal. This proved that the oxide of sodium was the reactant rather than sodium carbonate since sodium carbonate is unstable at high temperatures and converts to sodium oxide and carbon dioxide upon heating.

In early experiments starting with sodium-titanium bronze, when the effects of variables of temperature, time of reaction and ratio of NaCN to Ti were studied, it was determined that temperatures below 1000° C. were not satisfactory, whereas at 1000° C. the conversion from bronze to TiN was complete after a 20 hour reaction time. It was also found that the yield of whiskers was dependant on the ratio of bronze to cyanide, with the more cyanide present the greater the whisker yield. Typically, mixtures containing 0.2 g of bronze and sufficient NaCN were converted to TiN whiskers in 17 hours; whereas, with larger amounts of bronze on the order of 0.3–0.4 g, the reaction was not complete until 40 hours or more. Additionally, when the ratio of NaCN to Ti was 4, only a small amount of whiskers formed; whereas, the yield was significantly increased when the ratio was increased to 20. The stoichiometry of the reaction was deduced by measuring the weight loss on heating and by water extraction of the products:

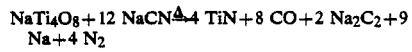

$NaTi_4O_8 + 12\ NaCN \rightarrow 4\ TiN + 8\ CO + 2\ Na_2C_2 + 9\ Na + 4\ N_2$

More recent versions of the process were conducted using TiN or $TiO_2$ in combination with $Na_2CO_3$ and NaCN and reacting at about 1000° C. for 15 to 70 hours. Sodium titanate ($Na_2O\ xTiO_2$; $x = 1.25$, 3 and 6) has also been reacted under similar conditions. The addition of $Na_2CO_3$ is not necessary under these conditions since $Na_2O$ is already present in the titanate.

It is possible to substitute KCN for NaCN with the result being shorter whiskers. Potassium titanates can also be substituted for sodium titanates, examples of which include, $K_2TiO_3$, $K_2Ti_6O_{13}$ and $K_2Ti_4O_9$. Other metals, including transition metals and alkali metals, can be substituted for titanium to form their respective metal nitride and/or carbonitrides in the forms of powders or whiskers. For instance, the reaction of NaCN with $K_2Cr_2O_7$ or $Na_2Cr_2O_7$ produced a mixture of chromium nitride and carbonitride. The reaction of NaCN with sodium vanadate (mainly $NaV_6O_{15}$) produced VN powder and $V^0$, and the reaction of $Na_2CO_3$-containing NaCN with $V_2O_5$ produced VN powder.

EXAMPLE 1

Several preparations of sodium titanium bronze (STB) were reacted with different amounts of NaCN at high temperatures of about 1000° C. under flowing nitrogen for periods ranging from 16 to 67 hours. The containers used, in the shape of crucibles or boats, were alumina, BN, glassy carbon and graphite. They were placed in nickel or fused silica apparatus provided with a thermocouple well and gas inlet and outlet ports.

TiN product was identified by X-ray diffraction (XRD), unreacted NaCN and $Na_2C_2$ were identified qualitatively by wet tests. Sometimes NaCN was identified by XRD on products before water extraction. Since only traces of $CO_2$ or none at all was evolved, it was concluded that the oxygen was evolved as CO. A confirmation of the volatilization of elemental sodium, an effect concluded from material balance calculation, was not sought experimentally. The STB was usually completely consumed, suggesting that whisker growth due to dislocations on the bronze crystals was not the mechanism. This conclusion is also supported indirectly by the results of an experiment on which STB powder was reacted with gaseous ammonia for 24 hours at 900° C. and yielded TiN powder quantitatively. The TiN yields were always close to 100% which would exclude the possibility that the whisker formation involved volatile titanium species. The TiN whiskers were examined by optical microscopy, transmission electron microscopy and EDX-EELS which confirmed that they were composed of Ti and N and were single crystals.

EXAMPLE 2

Referring to FIG. 1, a glassy carbon crucible 1, 35 mm ID × 35 mm, was placed on a graphite pedestal 2 in a 4.5 cm ID × 45 cm cylindrical nickel container 3 having an inner lining of titanium or stainless steel. The amount of titanium-containing compounds used as reactants was typically equivalent to about 6 mM of Ti and the ratio NaCN/Ti was typically 25. A glass joint 4 was used to cap the system. A nickel tube 5 was used to sparge a cover gas, preferably nitrogen, at about 300 ml/min. A teflon tube 6 served as an exit line to a water trap. The assembly was inserted in a vertical tubular furnace connected to a temperature controller and heated typically to 1000° C. In order to examine the products of the reactions the assembly was cooled while flowing inert gas was continued and the crucible removed with a long hooked wire. In cases where condensation of decomposition products prevented removal of the crucible, those products, some of which were $Na_2C_2$, were carefully dissolved with a jet of cold water from a washing bottle. The reaction of $H_2O$ with $Na_2C_2$ produced $H_2C_2$ which ignited spontaneously. The contents of the crucible were removed with hot water and digested over a hot plate for times ranging from 15 to 60 minutes. The solids were recovered by centrifugation, washed with water until the alkalinity had been removed, rinsed with ethanol or acetone and dried in an oven at 110° C. for 1–2 hours.

The residues were weighed and examined by a variety of techniques including optical microscopy, scanning electron microscopy (SEM), analytical electron microscopy (AEM) using a transmission electron microscope (TEM) equipped with x-ray energy dispersive spectroscopy (EDS) and/or electron energy loss spectroscopy (EELS) analyses, and x-ray diffraction (XRD). The results from applying all these techniques indicated, unequivocally, that the product of the studied reactions was comprised of TiN whiskers. The whiskers had an aspect ratio of about 30–50, with dimensions of 0.1–5 μm diameter and 50–10,000 μm length.

Representative successful preparations of TiN whiskers are summarized in Table I. Unless specified the container materials was vitreous (glassy) carbon, and nitrogen was the gas used to sparge through the system. From the table it can be seen that by varying the reactant/Ti ratios and the Ti source, whiskers of varying length can be prepared.

TABLE I

| Run # | Ti reagent | mM Ti | NaCN/Ti | Na₂O/Ti | Temp(°C.)/Time (h) | Comments | Product Appearance Under Optical Microscope |
|---|---|---|---|---|---|---|---|
| 320-III | TiN | 7.1 | 18.2 | 0.48 | 985/20 | graphite crucible | golden whiskers |
| 392 | TiN | 19.6 | 19.3 | 0.50 | 1016/42 | | some long golden whiskers |
| 329-II | TiO₂ | 11.2 | 21.4 | 0.50 | 994/68 | | mostly short whiskers |
| 335 | TiO₂ | 11.6 | 18.3 | 1.00 | 994/67 | | golden & brown whiskers |
| 352 | STB | 7.0 | 31.8 | 0.64 | 996/20 | Na₂CO₃ added | golden whiskers |
| 333 | Na₂Ti₆O₁₃ | 2.1 | 25.2 | 0.17 | 996/19 | | golden whiskers |
| 341 | Na₈Ti₅O₁₄ | 10.7 | 25.3 | 0.80 | 996/67 | | golden whiskers |
| 334 | Na₈Ti₅O₁₄ | 2.1 | 25.1 | 0.80 | 994/19 | | golden whiskers |
| 390 | Na₈Ti₅O₁₄ | 2.5 | 25.9 | 0.80 | 1016/19 | | long golden whiskers |
| 356 | Na₈Ti₅O₁₄ | 3.5 | 35.3 | 0.80 | 996/20 | NaF/Ti = 6.6 | short golden whiskers |
| 332 | Na₂Ti₃O₇ | 1.7 | 25.2 | 0.33 | 995/18 | | golden whiskers |

TABLE I-continued

| Run # | Ti reagent | mM Ti | NaCN/Ti | Na$_2$O/Ti | Temp(°C.)/Time (h) | Comments | Product Appearance Under Optical Microscope |
|---|---|---|---|---|---|---|---|
| 395 | Na$_2$Ti$_3$O$_7$ | 6.5 | 26.1 | 0.33 | 1012/19 | | golden whiskers |
| 399 | Na$_2$Ti$_3$O$_7$ | 5.3 | 29.2 | 0.33 | 1009/19 | NaF/Ti = 3.1 | short golden whiskers |
| 404 | Na$_2$Ti$_3$O$_7$ | 6.4 | 26.0 | 0.33 | 1012/18 | KCN used | very short golden whiskers |
| 406 | Na$_2$Ti$_3$O$_7$ | 6.9 | 26.4 | 0.33 | 1013/42 | NaCN/KCN = 1 | short golden whiskers |

This process is relatively simple and does not require stringent control of parameters such as purity of reagents, temperature and pressure. The reaction is sensitive to the reaction vessel dimensions and configuration; however, ascertaining the correct vessel for a scaled up or scaled down version of this process would be within the skill of an ordinary person in the art.

This process can be used to prepare high quality transition metal nitride whiskers, especially TiN whiskers which may be useful for toughening ceramics and other appropriate matrices. Ceramic composites are the subject of much industrial activity, and this development could have importance in the commercial arena.

I claim:

1. A process for making transition metal nitride whiskers comprising;

contacting a cyanide salt with a first compound selected from the group transition metal nitrides, transition metal oxides and a second compound selected from the group free alkali metal oxides and alkali metal oxides that are associated with anions that are not strong oxidants which would interfere with the reducing properties of the cyanide to form a mixture;

heating said mixture to a temperature of about 1000° C. for not less than 15 hours in an inert atmosphere.

2. The process of claim 1 wherein said first compound is selected from the group TiN, TiO$_2$, Nb$_2$O$_5$, V$_2$O$_5$ and MoO$_3$, said second compound is selected from the group sodium oxide, potassium oxide, sodium carbonate, potassium carbonate, sodium hydroxide and potassium hydroxide and said cyanide salt is selected from the group sodium cyanide and potassium cyanide.

3. A process for making transition metal nitride whiskers comprising;

contacting a cyanide salt with an alkali metal metallate to form a mixture;

heating said mixture to a temperature of about 1000° C. for not less than 15 hours in an inert atmosphere.

4. The process of claim 3 wherein said alkali metal metallate is selected from the group sodium-titanium bronze, Na$_2$Ti$_6$O$_{13}$, Na$_8$Ti$_5$O$_{14}$, Na$_2$Ti$_3$O$_7$, K$_2$TiO$_3$, K$_2$Ti$_6$O$_{13}$, K$_2$Ti$_4$O$_9$, K$_2$Cr$_2$O$_7$, Na$_2$Cr$_2$O$_7$, NaV$_6$O$_{15}$, and said cyanide salt is selected from the group sodium cyanide and potassium cyanide.

* * * * *